US005168247A

United States Patent [19]

Tarr

[11] Patent Number: 5,168,247

[45] Date of Patent: Dec. 1, 1992

[54] OSCILLATOR AND VOLTAGE-TO-FREQUENCY COVERTER EMPLOYING THE SAME

[75] Inventor: Morton H. Tarr, Bolton, Mass.

[73] Assignee: Data Translation, Inc., Marlboro, Mass.

[21] Appl. No.: 724,528

[22] Filed: Jun. 28, 1991

[51] Int. Cl.[5] .............................................. H03K 3/00

[52] U.S. Cl. .................................... 331/111; 331/172

[58] Field of Search ............... 331/135, 136, 111, 172, 331/173, 174

[56] References Cited

U.S. PATENT DOCUMENTS 4,365,212 12/1982 Gentile et al. .................. 331/172 X

OTHER PUBLICATIONS

"Linear Applications Handbook A Guide to Linear Circuit Design", from Linear Technology Corporation, Milpitas, CA (1990), pp. AN9-1 to AN9-20 and AN14-1 to AN14-20.

*Primary Examiner*—Robert J. Pascal

*Attorney, Agent, or Firm*—Fish & Richardson

[57] ABSTRACT

An oscillator including an oscillator input node for receiving an oscillator input analog signal, an oscillator output node for providing a train of output pulses having a frequency related to the magnitude of the input analog signal, a trigger gate component connected between the input node and the output node and having a low threshold and a high threshold, the gate component being in a path between the input and output without other active components and having a low input current in the range of 1 uA or less, a feedback switch connected in parallel to the trigger gate component and having a switch turn on threshold such that the switch is turned on to conduct current when the trigger gate is in one output state and is turned off when the trigger gate is in the other output state, and capacitance between a reference voltage and the input node so that the voltage at the input node ramps from one threshold to the other at a rate dependent on the input current.

19 Claims, 2 Drawing Sheets

OSCILLATOR AND VOLTAGE-TO-FREQUENCY COVERTER EMPLOYING THE SAME

BACKGROUND OF THE INVENTION

The invention relates to oscillators, and, in particular, to oscillators used in voltage-to-frequency converters.

Oscillators have many uses in circuitry, including use in phase locked loops and voltage-to-frequency converters, which might be used to digitize an analog signal in a data acquisition board.

One known type of voltage-to-frequency converter design converts the input voltage to a current that is summed with a feedback current based on the output frequency, the summed current being fed to an integrator that drives a voltage controlled oscillator that provides the output frequency. The feedback current and integrator are used to enhance linearity and stability.

It is also known to create an oscillator using a charging capacitor and a Schmitt trigger component that has two threshold values. Cycling is provided by repeatedly charging (or discharging) the capacitor from one threshold to the other at a rate that depends on the magnitude of an input control current.

SUMMARY OF THE INVENTION

The invention features, in general, a highly-reliable oscillator that is simply provided, and at low cost, by using a charging capacitance that is connected to an oscillator input node and a low input current Schmitt trigger gate component that is connected between the oscillator input node and an oscillator output node in parallel with a feedback switch. The trigger gate component is in a path between the input node and the output node that does not include any other active components. The use of a low input current (i.e., in the range of 1 uA or less) trigger gate component permits direct connection of the trigger gate component to the input node and charging capacitor without draining a substantial current that would distort the ramping and thus the linearity of the oscillator. The direct connection of the trigger gate component avoids the use and expense of additional active components between the charging capacitance and the trigger component. The direct connection of the feedback switch between the output of the trigger component and the charging capacitance also avoids the use and expense of additional components.

In preferred embodiments the trigger gate component is a CMOS inverter. The feedback switch can be one or two diodes in series; alternatively it can be a field effect transistor (FET). A current source receives an input voltage and outputs to the oscillator input node a current having a magnitude that is proportional to the input voltage. The current source includes a transistor having a base connected to receive the input voltage and a emitter and collector connected to provide the current to the oscillator input node.

A preferred application for the oscillator is in a voltage-to-frequency converter having a feedback loop that provides a feedback signal that is combined with an original input signal and used to generate a signal provided to the oscillator input node. The feedback loop includes a charge pump that is connected to the oscillator output node and provides a feedback current to a loop sum node that also receives an input current based on the original input signal. An integrator has an input connected to the loop sum node and an output that provides a voltage signal to a current source that provides a current signal to the oscillator input node.

Another application employing the oscillator is a phase locked loop circuit.

Other advantages and features of the invention will be apparent from the following description of the preferred embodiments thereof and from the claims.

DESCRIPTION OF THE PREFERRED EMBODIMENTS

The drawings will be described first.

DRAWINGS

STRUCTURE AND OPERATION

Figure 1:
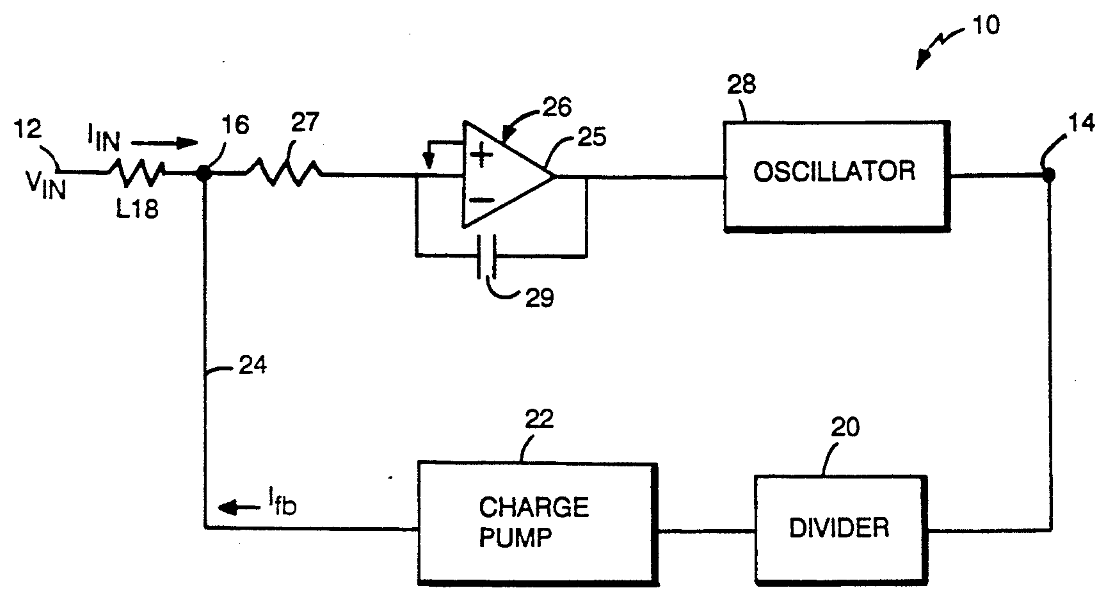
FIG. 1 is a block diagram of a voltage-to-frequency converter employing an oscillator according to the invention.

Referring to FIG. 1, there is shown voltage-to-frequency converter 10 having input node 12, output node 14, and loop sum node 16. Resistor 18 converts the input voltage, $V_{in}$, at node 12 to a current, $I_{in}$, provided to loop sum node 16. Divider 20 and charge pump 22 are used to provide a feedback current, $I_{fb}$, in line 24 to loop sum node 16. Between loop sum node 16 and output node 14 are integrator 26 and oscillator 28. Integrator 26 includes operational amplifier 25, which has its inverting input connected to loop sum node 16 through resistor 27 (1 Kohm), its noninverting input connected to ground, and capacitor 29 (0.1 uF) connected between its output and inverting input.

Figure 2:
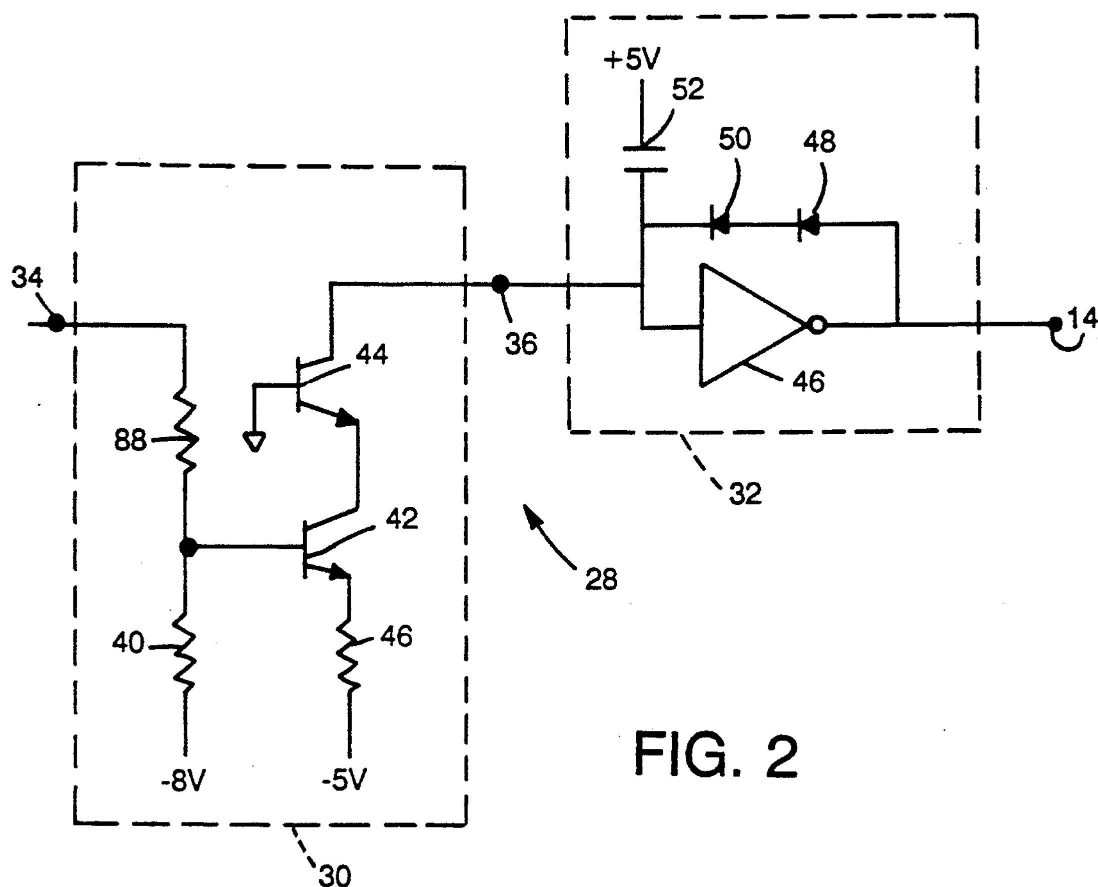
FIG. 2 is a schematic of the oscillator of the FIG. 1 converter.

Referring to FIG. 2, oscillator 28 includes current source 30 and current controlled oscillator 32. Current source 30 receives a voltage at node 34 (from integrator 26) and provides an output current at node 36. Source 30 includes a voltage divider provided by resistors 38 (4.02 Kohm) and 40 (8.06 Kohm). Source 30 also includes transistors 42 and 44 (2N3904). The base of transistor 42 is connected to the voltage divider node between resistors 38 and 40, and the emitter of transistor 42 is connected via resistor 46 (750 ohms) to a −5 volt reference voltage. The collector of transistor 42 is in turn connected to the emitter of transistor 44, the base of which is connected to ground and the collector of which is connected to output node 36.

Current controlled oscillator 32 includes CMOS Schmitt trigger gate inverter 46 (74AC14), two diodes 48, 50 (MMBD7000) connecting the output of Schmitt trigger gate inverter 46 to its input, and charging capacitor 52 connected between the input of Schmitt trigger gate inverter 46 and a 5 volt reference. The characteristics of Schmitt trigger gate inverter 46 are such that when its input is high, its output is low, and vice versa, and two thresholds control the switching between output states. In order to make the output change from low to high, the input must be more negative than the low threshold. When the output is high, the input must more positive than the high threshold in order to switch the output low. The inverter does not change its output when the input is between the low and the high thresholds. The device is a high-speed CMOS device, and has a low input current of less than 1 microamp. (By way of comparison, a high speed TTL component, 74F14, has input current of 20 microamps in one state and 600 microamps in the other, and a medium speed TTL component, 74AlS14, has input current of 20 microamps in one state and 100 microamps in the other.)

In operation, the input voltage, $V_{in}$, at input node 12 is converted to a pulse train at output node 14 having a frequency that is directly related to the input voltage. The input voltage (which has a range of 0 to −4.0 V) is converted by resistor 18 to an input current, $I_{in}$, provided to loop sum node 16. Integrator 26 converts the sum of the input current and feedback current ($I_{in}$ and $I_{fb}$) into a voltage that is converted to a frequency output at oscillator 28. The output is provided at output node 14 and is also used to generate the feedback current, $I_{fb}$. The output is divided by divider 20 in order to bring the frequency into a range that can be accurately used by charge pump 22. Charge pump 22 generates a current that is proportional to the output frequency. This feedback current is provided over line 24 to loop sum node 16. Op amp 25 of integrator 26, having its noninverting input connected to ground and its inverting input connected to loop sum node 16, operates toward keeping the summed current at loop sum node 16 ($I_{in}+I_{fb}$) at zero. If the input voltage, $V_{in}$, is stable, then the summed current at loop sum node 16 will stay at zero. If the input voltage moves more positive, the output of the op amp will be driven more negative, decreasing the output of current source 30, thereby decreasing the frequency of oscillator 28 and decreasing the feedback current, $I_{fb}$, which is negative, stabilizing the circuit when the feedback current matches the input current once again. If the input voltage goes negative, this creates an increase in the input current, driving the output of op amp 25 in a positive direction, increasing the output frequency and the feedback current until once again it matches the input current.

Current source 30 converts a voltage at node 34 to a proportional current at node 36, and current controlled oscillator 32 converts the current at node 36 to a train of pulses at node 14 having a frequency that is proportional to the current at node 36. Current source 30 has an output range of 0 to 6 mA, which corresponds to an input voltage range of −5 to 0 volts Schmitt trigger gate inverter 46 cycles between its low and high outputs. The effective capacitance from node 36 to the reference voltage includes capacitor 52 and capacitance provided by components 44, 46, 48, and 50. When the output of inverter 46 is low, capacitor 52 and the other sources of capacitance between node 36 and the reference voltage are discharged by current sunk by source 30, with the input voltage at inverter 46 decreasing at a rate that is proportional to the current at node 36. When the low input threshold (+2 V) of inverter 46 is reached, its output goes high; diodes 48, 50 switch on (become conductive); capacitor 52 and other sources of capacitance are quickly charged, and the voltage at in input to inverter 46 quickly increases until the high threshold (+3 V) of inverter 46 is reached, at which time the output of inverter 46 goes low, and capacitor 52 and other capacitance begin slowly discharging once again. Diodes 48, 50 each have a drop of 0.7 volt, providing a combined drop of 1.4 volts, in order to make the output pulse of desired width. Oscillator 32 can be operated over the wide range of from 1 Hz to 40 MHz. Schmitt trigger input gate inverter 46 desirably draws low current (thereby avoiding distortion of the ramping and linearity of the oscillator), and additionally is inexpensive and can be operated at high-speed.

Other Schmitt trigger components having the desired low input current could be used besides high-speed CMOS components, e.g., medium speed CMOS components (e.g., 74HC14) and components based on gallium arsenide.

The preferred use for voltage-to-frequency converter 10 is in a high-precision data acquisition board that converts an input voltage to a 24-bit digital Operating at 40 MHz, the board can resolve a 24-bit number in ½ second.

Figure 3:
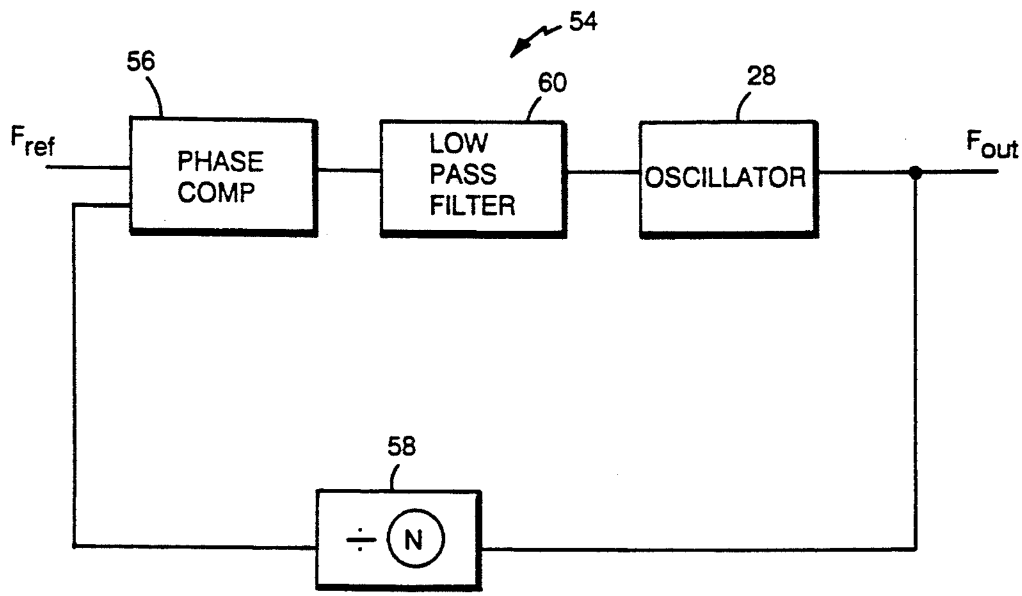
FIG. 3 is a block diagram of a phase locked loop circuit employing an oscillator according to the invention.

The FIG. 2 oscillator can be used in other applications, e.g., in phase locked loop 54 shown in FIG. 3. Phase locked loop 54 includes phase comparator 56, which compares a reference frequency with a feedback signal from divide-by-N circuit 58. Phase comparator 56 provides a correction signal, based upon the difference in phase of the two inputs, which is passed through low pass filter 60 and used as the input to oscillator 28, which provides an output $F^{out}$ that is equal to $F_{ref}$X N. Oscillator 28 accurately provides a wide range of output frequencies at low cost.

Figure 4:
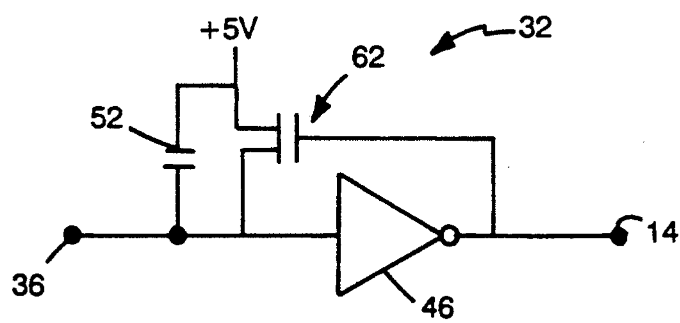
FIG. 4 is a schematic of an alternative circuit for the FIG. 2 oscillator.

Other embodiments of the invention are within the scope of the following claims. E.g., as illustrated in FIG. 4, the feedback switch of oscillator 32 can be implemented using FET 62 (SD211) in place of diodes 48, 50. Also, the path between the input node and output node that includes the trigger gate component might also include passive components such as resistors.

What is claimed is:

1. An oscillator comprising an oscillator input node for receiving an oscillator input analog signal, an oscillator output node for providing a train of output pulses having a frequency related to the magnitude of said input analog signal, a trigger gate component in a path between said input node and said output node without any other active component, said trigger gate component having a low threshold and a high threshold, said trigger gate component having a high output when its input is more negative than said low threshold and having a low output when its input is more positive than said high threshold, said trigger gate component not changing its output when said input is between said low and high thresholds, said gate component having a low input current in the range of 1 uA or less, a feedback switch connected in parallel to said trigger gate component and having a switch turn on threshold such that said switch is turned on to conduct current when said trigger gate is in one output state and is turned off when said trigger gate is in the other output state, and means for providing capacitance between a reference voltage node and said input node so that the voltage at said input node ramps from one threshold to the other at a rate dependent on said input current when said trigger gate component is in said other output state and said switch is turned off, and said voltage at said input node quickly ramps in the other direction at a fixed rate when said trigger gate component is in said one output state and said switch is turned on.

2. The oscillator of claim 1 wherein said trigger gate component is a CMOS inverter.

3. The oscillator of claim 1 wherein said feedback switch comprises one or two diodes in series.

4. The oscillator of claim 1 wherein said switch is an FET.

5. The oscillator of claim 1 further comprising a current source that receives an input voltage and outputs to said oscillator input node a current having a magnitude that is proportional to said input voltage.

6. The oscillator of claim 5 wherein said current source includes a transistor having a base connected to receive said input voltage and a base and collector connected to provide said current to said oscillator input node.

7. The oscillator of claim 2 further comprising a current source that receives an input voltage and outputs to said oscillator input node a current having a magnitude that is proportional to said input voltage.

8. The oscillator of claim 7 wherein said current source includes a transistor having a base connected to receive said input voltage and a base and collector connected to provide said current to said oscillator input node.

9. The oscillator of claim 1 further comprising a feedback loop that is connected to provide a feedback signal that is combined with an original input signal and used to generate said oscillator input analog signal provided to said oscillator input node.

10. The oscillator of claim 1 wherein said means for providing a capacitance includes a capacitor connected between said reference voltage and said input node.

11. The oscillator of claim 1 wherein said trigger gate component is directly connected between said input node and said output node.

12. A voltage-to-frequency converter comprising an oscillator input node for receiving an oscillator input analog signal, an oscillator output node for providing a train of output pulses having a frequency related to the magnitude of said input analog signal, a trigger gate component in a path between said input node and said output node without any other active component, said trigger gate component having a low threshold and a high threshold, said trigger gate component having a high output when its input is more negative than said low threshold and having a low output when its input is more positive than said high threshold, said trigger gate component not changing its output when said input is between said low and high thresholds, said gate component having a low input current in the range of 1 uA or less, a feedback switch connected in parallel to said trigger gate component and having a switch turn on threshold such that said switch is turned on to conduct current when said trigger gate is in one output state and is turned off when said trigger gate is in the other output state, means for providing capacitance between a reference voltage node and said input node so that the voltage at said input node ramps from one threshold to the other at a rate dependent on said input current when said trigger gate component is in said other output state and said switch is turned off, and said voltage at said input node quickly ramps in the other direction at a fixed rate when said trigger gate component is in said one output state and said switch is turned on, and a feedback loop that is connected to provide a feedback signal that is combined with an original input signal and used to generate said oscillator input analog signal provided to said oscillator input node.

13. The converter of claim 12 wherein said feedback loop includes a charge pump that is connected to said oscillator output node and provides a feedback current to a loop sum node that also receives an input current based on said original input signal.

14. The converter of claim 13 wherein an integrator having an input connected to said loop sum node and an output connected to said oscillator input node.

15. The converter of claim 14 wherein said integrator is connected to said oscillator input node through a current source that receives an voltage signal from said integrator and outputs to said oscillator input node a current having a magnitude that is proportional to said voltage signal.

16. The converter of claim 15 wherein said current source includes a transistor having a base connected to receive said input voltage and a base and collector connected to provide said current to said oscillator input node.

17. The converter of claim 16 wherein said trigger gate component is a CMOS inverter.

18. The converter of claim 14 wherein said integrator includes an operational amplifier.

19. A phase locked loop circuit including the oscillator of claim 1 and a phase comparator that is connected to receive a signal based on the oscillator output and to provide a correction signal as the oscillator input.

* * * * *